US012800665B2

(12) United States Patent
Pan

(10) Patent No.: US 12,800,665 B2
(45) Date of Patent: Nov. 17, 2026

(54) DISPLAYED POWER CORRECTION METHOD AND DEVICE

(71) Applicant: Getac Technology Corporation, New Taipei (TW)

(72) Inventor: Jia-Yang Pan, Taipei (TW)

(73) Assignee: Getac Technology Corporation, New Taipei (TW)

( * ) Notice: Subject to any disclaimer, the term of this patent is extended or adjusted under 35 U.S.C. 154(b) by 262 days.

(21) Appl. No.: 18/731,479

(22) Filed: Jun. 3, 2024

(65) Prior Publication Data

US 2025/0172619 A1 May 29, 2025

(30) Foreign Application Priority Data

Nov. 28, 2023 (CN) ........................ 202311616134.1

(51) Int. Cl.

*G01R 31/374* (2019.01)
*G01R 31/36* (2020.01)
*G01R 31/3842* (2019.01)
*H01M 10/48* (2006.01)

(52) U.S. Cl.

CPC ....... *G01R 31/374* (2019.01); *G01R 31/3646* (2019.01); *G01R 31/3842* (2019.01); *H01M 10/488* (2013.01)

(58) Field of Classification Search

None

See application file for complete search history.

(56) References Cited

U.S. PATENT DOCUMENTS 5,483,165 A * 1/1996 Cameron ................ B60L 58/22 340/636.15
5,912,544 A * 6/1999 Miyakawa ....... G01R 19/16542 320/152
6,456,037 B1 * 9/2002 Jakl ....................... H01M 10/44 320/133

(Continued)

FOREIGN PATENT DOCUMENTS

CN 112014749 A 12/2020
CN 116125293 A 5/2023

(Continued)

OTHER PUBLICATIONS

Extended European Search Report, Apr. 1, 2025, Germany.
Taiwan Patent Office, "Office Action", Jun. 17, 2024. Taiwan.

*Primary Examiner* — Richard Isla

(74) *Attorney, Agent, or Firm* — Troutman Pepper Locke LLP; Tim Tingkang Xia, Esq.

(57) ABSTRACT

A displayed power correction method, adapted to a target battery with a battery temperature lower than a threshold temperature, is performed by a controller and includes: determining whether the target battery is a first type battery or a second type battery according to designed power of the target battery, lowering displayed power according to a first default rate of the first type battery when the target battery is the first type battery and a battery cell voltage of the target battery is lower than a threshold voltage, and lowering displayed power according to a second default rate of the second type battery when the target battery is the second type battery and a capacity parameter or a voltage parameter of the target battery is higher than a default value.

12 Claims, 5 Drawing Sheets

(56) References Cited

U.S. PATENT DOCUMENTS

| | | | | |
|---|---|---|---|---|
| 7,525,280 | B2 * | 4/2009 | Fagan | H02J 7/448<br>320/110 |
| 9,407,098 | B2 * | 8/2016 | Sebastiani | H01M 10/4221 |
| 9,853,470 | B2 * | 12/2017 | Hatsumi | B60C 9/00 |
| 10,020,548 | B2 * | 7/2018 | Yu | G01R 31/389 |
| 2003/0222867 | A1 * | 12/2003 | Bean | H02J 7/80<br>345/211 |
| 2023/0093677 | A1 | 3/2023 | He et al. | |

FOREIGN PATENT DOCUMENTS

| | | | |
|---|---|---|---|
| CN | 116794515 | A | 9/2023 |
| TW | 542915 | B | 7/2003 |
| TW | 202248805 | A | 12/2022 |

* cited by examiner

DISPLAYED POWER CORRECTION METHOD AND DEVICE

CROSS-REFERENCE TO RELATED APPLICATIONS

This non-provisional application claims priority under 35 U.S.C. § 119(a) on Patent Application No(s). 202311616134.1 filed in China on Nov. 28, 2023, the entire contents of which are hereby incorporated by reference.

BACKGROUND

1. Technical Field

This disclosure relates to a displayed power correction method and device.

2. Related Art

As personalized electronic devices become more and more popular, these electronic devices have been applied in various fields. For example, the electronic device may be a notebook computer or the like.

In some more extreme cases, electronic devices may need to operate in extremely low temperature environments. However, in an extremely low temperature environment, the correct power of the electronic device may not be detected due to the influence of temperature, and thus the battery power of the electronic device may not show a linear decrease. Therefore, when an electronic device is used at extremely low temperatures, the displayed battery power may be inaccurate, causing the electronic device to shut down abnormally.

SUMMARY

Accordingly, this disclosure provides a displayed power correction method and device.

According to one or more embodiment of this disclosure, a displayed power correction method, adapted to a target battery with a battery temperature lower than a threshold temperature, is performed by a controller and includes: determining whether the target battery is a first type battery or a second type battery according to designed power of the target battery; lowering displayed power of the first type battery according to a first default rate when the target battery is the first type battery and a battery cell voltage of the target battery is lower than a threshold voltage; and lowering displayed power of the second type battery according to a second default rate when the target battery is the second type battery and a capacity parameter or a voltage parameter of the target battery is higher than a default value.

According to one or more embodiment of this disclosure, a displayed power correction device, adapted to a target battery with a battery temperature lower than a threshold temperature, includes: a power indicator and a controller. The power indicator is configured to read designed power of the target battery. The controller is connected to the power indicator and configured to perform the displayed power correction method described above.

In view of the above description, according to one or more embodiments of the displayed power correction method and device of the present disclosure, even if an electronic device (for example, a laptop) equipped with the target battery is used under extreme low temperature, the abnormal shut down of the electronic device due to inaccurate displayed power may be avoided.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. According to the description, claims and the drawings disclosed in the specification, one skilled in the art may easily understand the concepts and features of the present invention. The following embodiments further illustrate various aspects of the present invention, but are not meant to limit the scope of the present invention.

Figure 1:
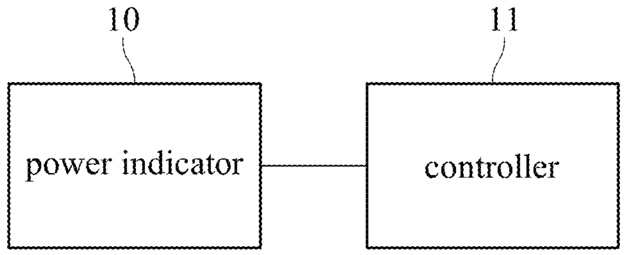
FIG. 1 is a block diagram illustrating a displayed power correction device according to an embodiment of the present disclosure.

Please refer to FIG. 1, wherein FIG. 1 is a block diagram illustrating a displayed power correction device according to an embodiment of the present disclosure. The displayed power correction device 1 is adapted to a target battery with a battery temperature lower than a threshold temperature. For example, the threshold temperature is −10° C. A shown in FIG. 1, the displayed power correction device 1 includes a power indicator 10 and a controller 11. The power indicator 10 is connected to the controller 11.

The power indicator 10 may be a voltmeter and/or an ammeter. The power indicator 10 is configured to read a gauge of the target battery to obtain designed power of the target battery, meaning the rated capacity of the target battery. For example, the designed power may include a designed voltage and a designed current. The controller 11 may include one or more processors, said processor is, for example, a central processing unit, a graphics processing unit (GPU), a microcontroller, a programmable logic controller (PLC) or any other processor with signal processing functions. The controller 11 is configured to correct displayed power corresponding to the target battery based on the designed power read by the power indicator 10.

Figure 2:
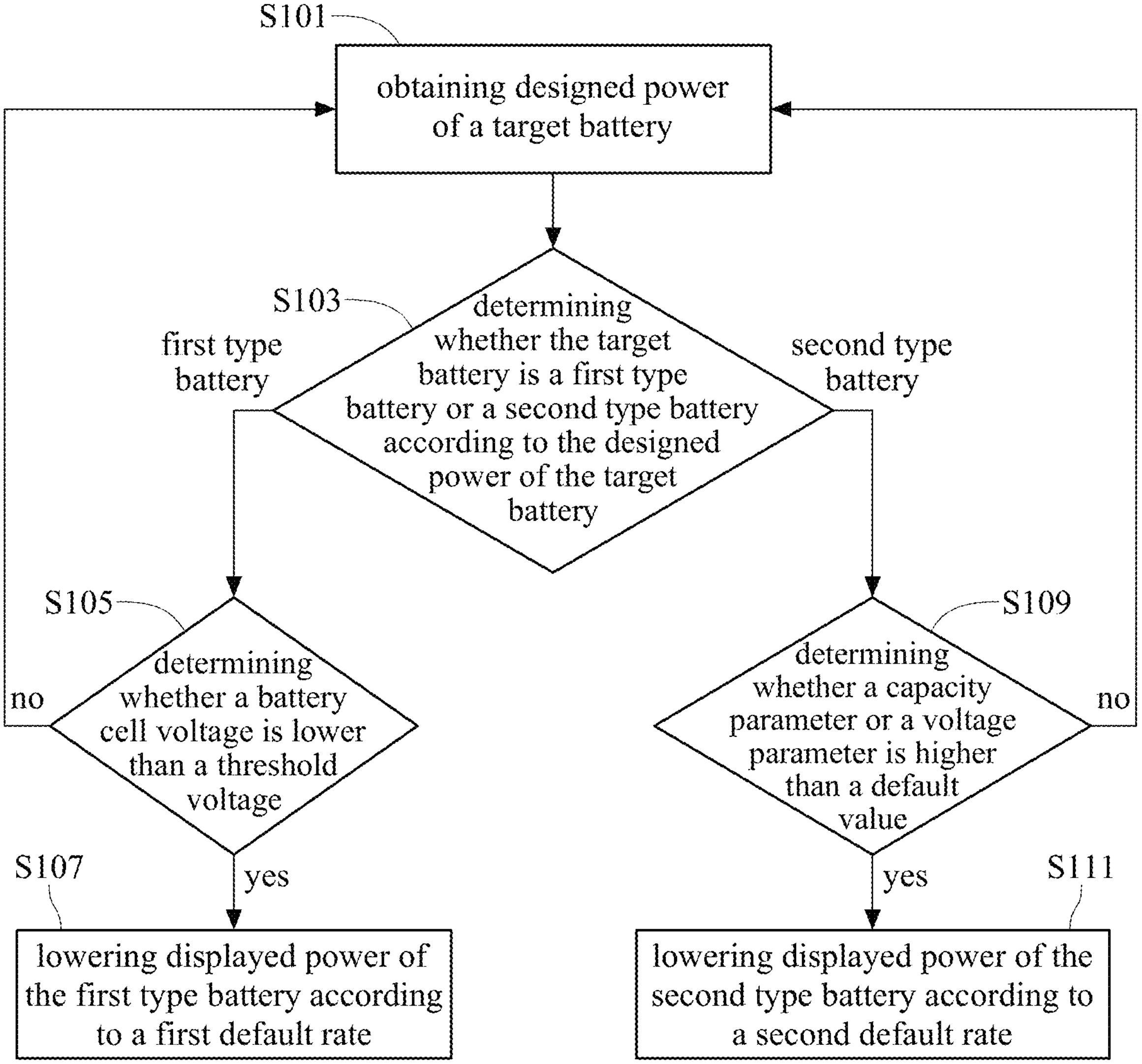
FIG. 2 is a flowchart illustrating a displayed power correction method according to an embodiment of the present disclosure.

To explain the displayed power correction device 1 and the displayed power correction method in more detail, please refer to FIG. 1 and FIG. 2, wherein FIG. 2 is a flowchart illustrating a displayed power correction method according to an embodiment of the present disclosure. As shown in FIG. 2, the displayed power correction method includes: step S101: obtaining the designed power of the target battery; step S103: determining whether the target battery is a first type battery or a second type battery according to the designed power of the target battery; when the determination result of step S103 is "first type battery", performing step S105: determining whether a battery cell voltage is lower than a threshold voltage; when the determination result of step S105 is "yes", performing step S107: lowering displayed power of the first type battery according to a first default rate; when the determination result of step S105 is "no", performing step S101; when the determination result of step S103 is "second type battery", performing step S109: determining whether a capacity parameter or a voltage parameter is higher than a default value; when the determination result of step S109 is "yes", performing step S111: lowering displayed power of the second type battery according to a second default rate; and when the determination result of step S109 is "no", performing step S101.

In step S101, the controller 11 receives the designed power of the target battery from the power indicator 10. In step S103, the controller 11 determines whether the target battery is the first type battery or the second type battery according to the designed power of the target battery. For example, the first type battery is a cylindrical battery, and the second type battery is a prismatic battery.

When the controller 11 determines that the target battery is the first type battery, the controller 11 further performs step S105 to determine whether the battery cell voltage of any one of a plurality of battery cells of the target battery is lower than the threshold voltage. For example, the threshold voltage is 3 volts. When the controller 11 determines that the battery cell voltage is lower than the threshold voltage, the controller 11 performs step S107 to lower the displayed power of the target battery according to the first default rate. On the contrary, when the controller 11 determines that the battery cell voltage is not lower than the threshold voltage, the controller 11 performs step S101 again.

When the controller 11 determines that the target battery is the second type battery, the controller 11 further performs step S109 to determine whether the capacity parameter or the voltage parameter is higher than the default value. The capacity parameter may be a difference value between a current full charge capacity and a previous full charge capacity. The default value corresponding to the capacity parameter may be 150 mAh. The current full charge capacity may be the full charge capacity of the target battery at the moment, and the previous full charge capacity may be the previously normal full charge capacity of the target battery (for example, the full charge capacity of the target battery when the target battery is sent out of the factory). The voltage parameter may be a current voltage of the target battery, and the default value corresponding to the voltage parameter may be a default battery dead voltage.

When the controller 11 determines that the capacity parameter or the voltage parameter of the target battery is higher than the corresponding default values, the controller 11 performs step S111 to lower the displayed power of the target battery according to the second default rate. On the contrary, when the controller 11 determines that the capacity parameter and the voltage parameter of the target battery both are not higher than the corresponding default values, the controller 11 performs step S101 again.

In an embodiment, the first default rate may be different from the second default rate. Further, the first default rate may be lower than the second default rate. For example, the first default rate may be lowering the displayed power by 1% every 20 seconds, and the second default rate may be lowering the displayed power by 1% every 15 seconds.

Accordingly, even if an electronic device (for example, a laptop) equipped with the target battery is used under extreme low temperature, the abnormal shut down of the electronic device due to inaccurate displayed power may be avoided.

Figure 3:
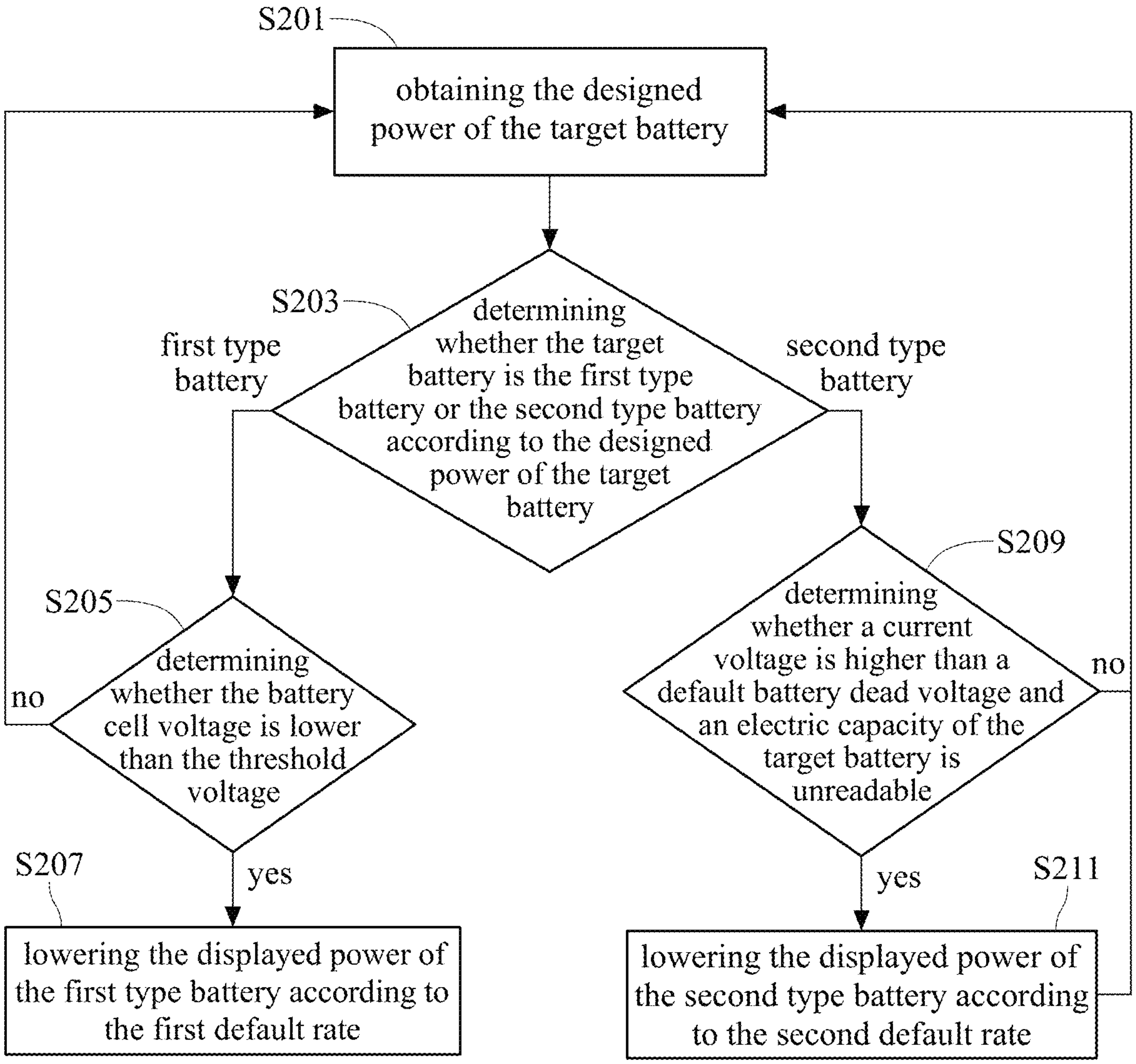
FIG. 3 is a flowchart illustrating a displayed power correction method according to another embodiment of the present disclosure.

Please refer to FIG. 1 and FIG. 3, wherein FIG. 3 is a flowchart illustrating a displayed power correction method according to another embodiment of the present disclosure. As shown in FIG. 3, the displayed power correction method includes: step S201: obtaining the designed power of the target battery; step S203: determining whether the target battery is the first type battery or the second type battery according to the designed power of the target battery; when the determination result of step S203 is "first type battery", performing step S205: determining whether the battery cell voltage is lower than the threshold voltage; when the determination result of step S205 is "yes", performing step S207: lowering the displayed power of the first type battery according to the first default rate; when the determination result of step S205 is "no", performing step S201; when the determination result of step S203 is "second type battery", performing step S209: determining whether a current voltage is higher than the default battery dead voltage and an electric capacity of the target battery is unreadable; when the determination result of step S209 is "yes", performing step S211: lowering the displayed power of the second type battery according to the second default rate; and when the determination result of step S209 is "no", performing step S201.

Steps S201, S203, S205, S207 and S211 of FIG. 3 may be the same as steps S101, S103, S105, S107 and S111 of FIG. 2, respectively, their descriptions are not repeated herein.

In step S209, the controller 11 determines whether the current voltage of the target battery is higher than the default battery dead voltage and is unable to read the electric capacity of the target battery, wherein the implementation of determining whether the current voltage of the target battery is higher than the default battery dead voltage is described above.

The controller 11 being unable to read the electric capacity of the target battery may refer to when the target battery does not report battery capacity to the battery voltameter, which causes the controller 11 to be unable to read the electric capacity of the target battery from battery voltameter. When the controller 11 determines that the current voltage is higher than the default battery dead voltage and the target battery does not report the battery capacity, the controller 11 performs step S211. In other words, step S211 may be performed when the current voltage is higher than the default battery dead voltage and the electric capacity of the target battery is unreadable.

Figure 4:
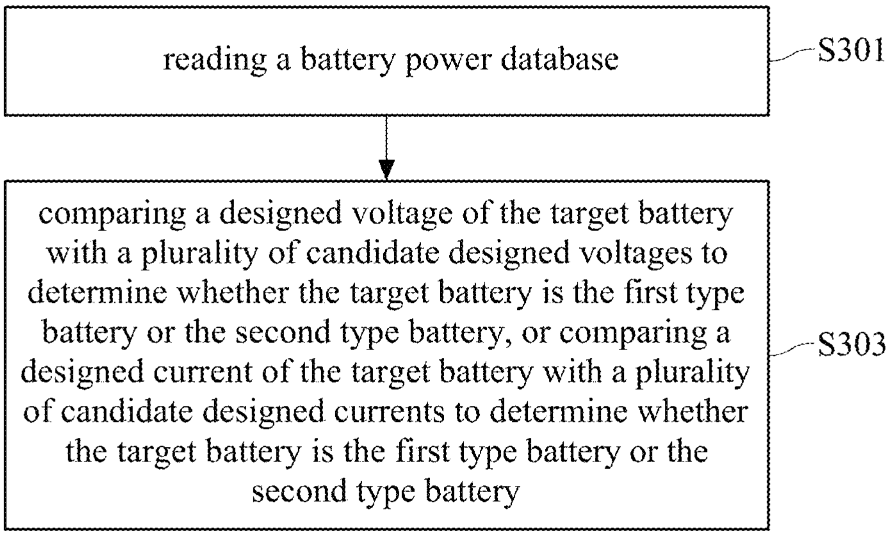
FIG. 4 is a flowchart illustrating determining battery type according to an embodiment of the present disclosure.

Please refer to FIG. 1 and FIG. 4, wherein FIG. 4 is a flowchart illustrating determining battery type according to an embodiment of the present disclosure. FIG. 4 may be regarded as a detailed flowchart of an embodiment of step S103 of FIG. 2 and step S203 of FIG. 3. As shown in FIG. 4, the method of determining battery type includes: step S301: reading a battery power database, wherein the battery power database comprises a candidate designed voltage and a candidate designed current of each of the first type battery and the second type battery; and step S303: comparing the designed voltage of the target battery with the candidate designed voltages to determine whether the target battery is the first type battery or the second type battery, or comparing the designed current of the target battery with the candidate designed currents to determine whether the target battery is the first type battery or the second type battery.

As described above, the designed power of the target battery may include the designed voltage and the designed current. The battery power database stores the candidate designed voltage and the candidate designed current of the first type battery and the candidate designed voltage and the candidate designed current of the second type battery. For example, the method of storing the candidate designed voltages and the candidate designed currents may be implemented as table 1 below, but the present disclosure is not limited thereto.

TABLE 1

| battery type | candidate designed voltage | candidate designed current |
|---|---|---|
| first type battery | first candidate designed voltage | first candidate designed current |
| second type battery | second candidate designed voltage | second candidate designed current |

In step S301, the controller 11 reads the battery power database. In step S303, the controller 11 compares the designed voltage of the target battery with the first candidate designed voltage and the second candidate designed voltage. When the comparison result shows that the designed voltage of the target battery is the same as the first candidate designed voltage, the controller 11 may determine that the target battery is the first type battery.

Or, in step S303, the controller 11 compares the designed current of the target battery with the first candidate designed current and the second candidate designed current. When the comparison result shows that the designed current of the target battery is the same as the first candidate designed current, the controller 11 may determine that the target battery is the first type battery.

Figure 5:
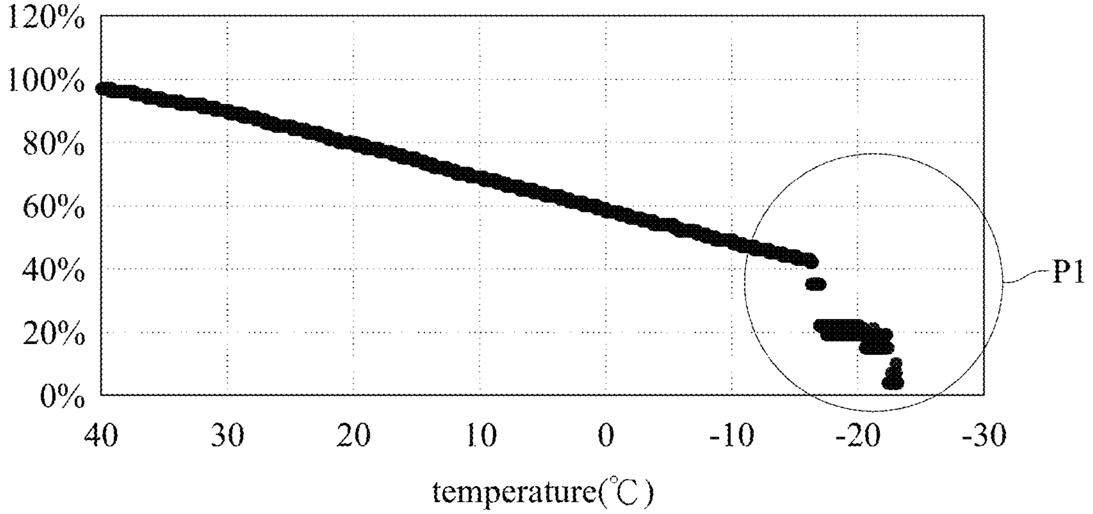
FIG. 5 shows displayed power of not applying the displayed power correction method and device of the present disclosure.
Figure 6:
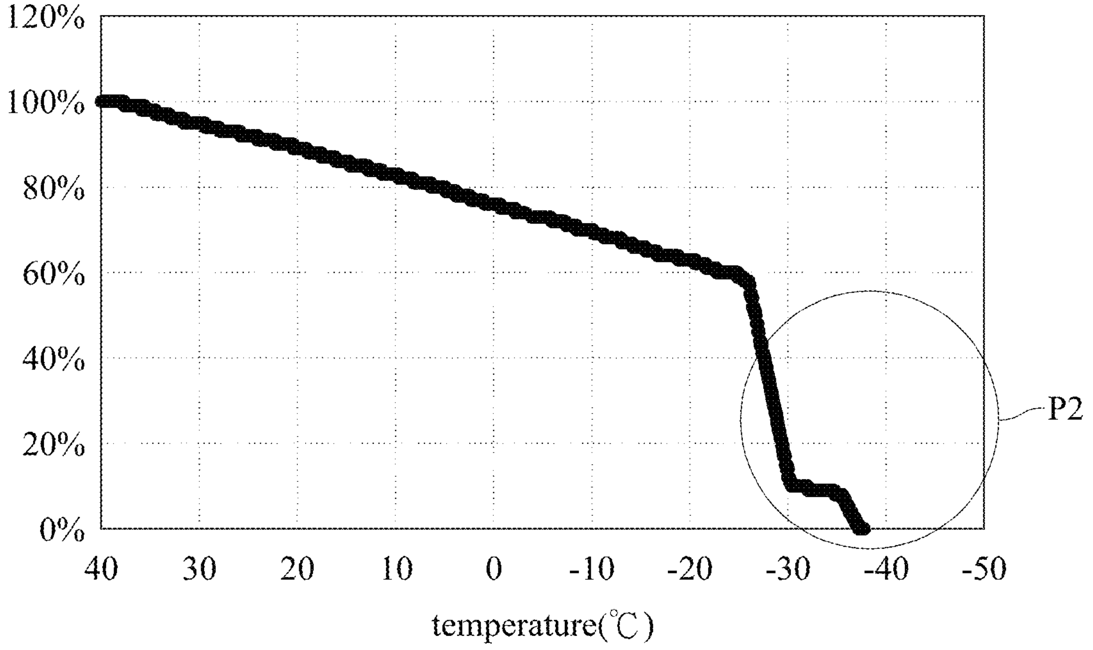
FIG. 6 shows displayed power of applying the displayed power correction method and device of the present disclosure.

Please refer to FIG. 5 and FIG. 6, wherein FIG. 5 shows displayed power of not applying the displayed power correction method and device of the present disclosure, and FIG. 6 shows displayed power of applying the displayed power correction method and device of the present disclosure. The vertical axis in FIG. 5 and FIG. 6 is power (%), and the horizontal axis in FIG. 5 and FIG. 6 is temperature.

In FIG. 5, as shown by portion P1, when the displayed power correction method and device of the present disclosure is not applied and when the ambient temperature lowers to the range of −20° C. and −30° C., the power the target battery is displayed abnormally (that is, missing data points).

In FIG. 6, as shown by portion P2, when the displayed power correction method and device of the present disclosure is applied, even if the ambient temperature lowers to the range of −30° C. and −40° C., the power the target battery is still displayed normally (that is, no data point is missing). Therefore, the abnormal shut down of the electronic device due to inaccurate displayed power may be avoided.

In view of the above description, according to one or more embodiments of the displayed power correction method and device of the present disclosure, even if an electronic device (for example, a laptop) equipped with the target battery is used under extreme low temperature, the abnormal shut down of the electronic device due to inaccurate displayed power may be avoided.

What is claimed is:

1. A displayed power correction method, adapted to a target battery with a battery temperature lower than a threshold temperature, performed by a controller and comprising:

determining whether the target battery is a first type battery or a second type battery according to designed power of the target battery;

lowering displayed power of the first type battery according to a first default rate when the target battery is the first type battery and a battery cell voltage of the target battery is lower than a threshold voltage; and lowering displayed power of the second type battery according to a second default rate when the target battery is the second type battery and a capacity parameter of the target battery is higher than a default value;

wherein the capacity parameter is a difference value between a current full charge capacity and a previous full charge capacity; and wherein the default value corresponding to the capacity parameter is 150 mAh.

2. The displayed power correction method according to claim 1, wherein the first type battery is a cylindrical battery, and the second type battery is a prismatic battery.

3. The displayed power correction method according to claim 1, wherein the first default rate is lower than the second default rate.

4. The displayed power correction method according to claim 1, wherein the designed power comprises a designed voltage and a designed current.

5. The displayed power correction method according to claim 4, wherein determining whether the target battery is the first type battery or the second type battery according to the designed power of the target battery comprises:

reading a battery power database, wherein the battery power database comprises a candidate designed voltage and a candidate designed current of each of the first type battery and the second type battery; and comparing the designed voltage of the target battery with the candidate designed voltages to determine whether the target battery is the first type battery or the second type battery, or comparing the designed current of the target battery with the candidate designed currents to determine whether the target battery is the first type battery or the second type battery.

6. The displayed power correction method according to claim 5, wherein the battery cell voltage is a voltage of any one of a plurality battery cells of the target battery.

7. A displayed power correction device, adapted to a target battery with a battery temperature lower than a threshold temperature, comprising:

a power indicator configured to read designed power of the target battery; and a controller connected to the power indicator, the controller configured to perform the displayed power correction method according to claim 1.

8. A displayed power correction device, adapted to a target battery with a battery temperature lower than a threshold temperature, comprising:

a power indicator configured to read designed power of the target battery; and a controller connected to the power indicator, the controller configured to perform the displayed power correction method according to claim 2.

9. A displayed power correction device, adapted to a target battery with a battery temperature lower than a threshold temperature, comprising:

a power indicator configured to read designed power of the target battery; and a controller connected to the power indicator, the controller configured to perform the displayed power correction method according to claim 3.

10. A displayed power correction device, adapted to a target battery with a battery temperature lower than a threshold temperature, comprising:

a power indicator configured to read designed power of the target battery; and a controller connected to the power indicator, the controller configured to perform the displayed power correction method according to claim 4.

11. A displayed power correction device, adapted to a target battery with a battery temperature lower than a threshold temperature, comprising:

a power indicator configured to read designed power of the target battery; and a controller connected to the power indicator, the controller configured to perform the displayed power correction method according to claim 5.

12. A displayed power correction device, adapted to a target battery with a battery temperature lower than a threshold temperature, comprising:

a power indicator configured to read designed power of the target battery; and a controller connected to the power indicator, the controller configured to perform the displayed power correction method according to claim 6.

* * * * *